April 2, 1968 L. BUDTS 3,376,516
TRANSISTORIZED SWITCHING AMPLIFIER WITH PROTECTIVE CIRCUIT
Filed March 2, 1965
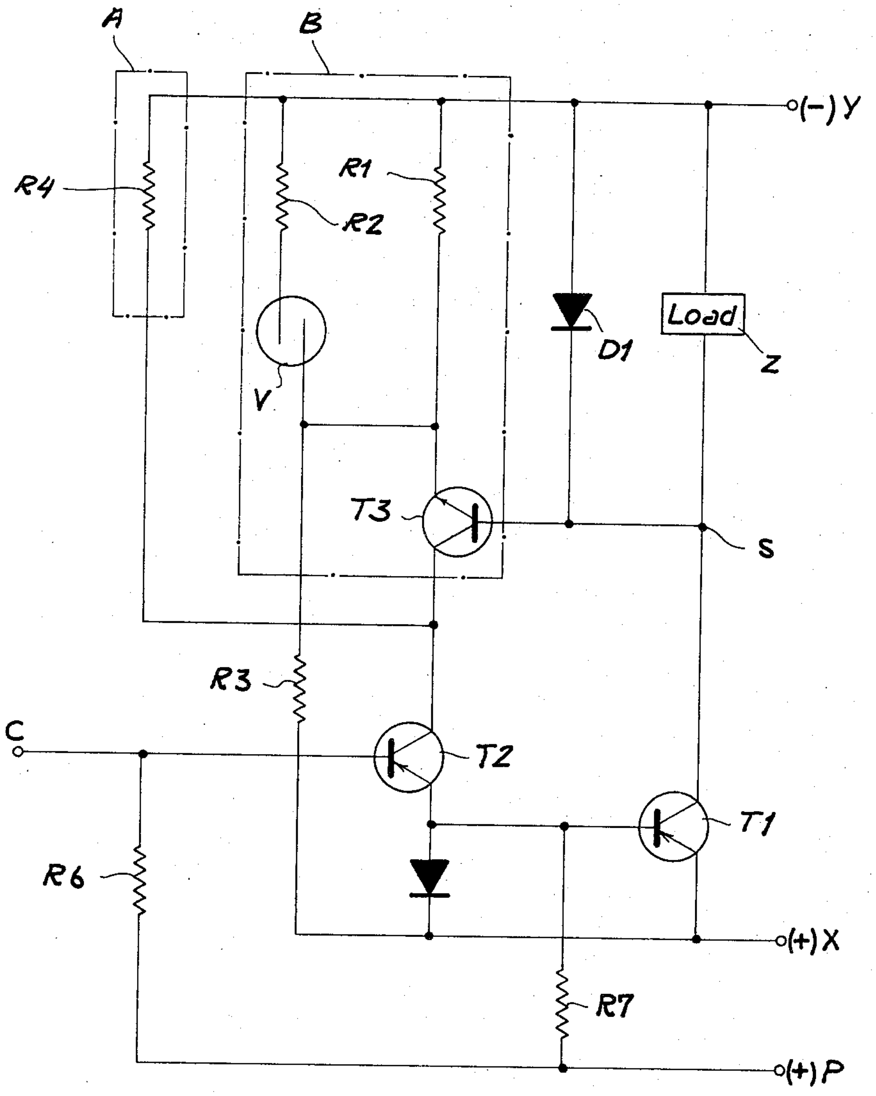
Lucien Budts
INVENTOR.
BY
Karl G. Ross
Attorney 3,376,516

TRANSISTORIZED SWITCHING AMPLIFIER WITH PROTECTIVE CIRCUIT

Lucien Budts, Paris, France, assignor to Thomson Automatismes, Chatou, France, a corporation of France Filed Mar. 2, 1965, Ser. No. 436,574
Claims priority, application France, Mar. 18, 1964, 967,851, Patent 1,397,415
8 Claims. (Cl. 330—26)

ABSTRACT OF THE DISCLOSURE

Switching amplifier with two transistor stages and a control transistor connected therewith in an unstable circuit whereby the output stage is turned fully on in the presence of an input signal and cut off in the absence of such signal, the control transistor being so connected across a load energized from the output stage as to become blocked upon an abnormal reduction in load impedance whereupon the load current is reduced under the control of a fixed output resistance.

The present invention relates to direct-current amplifier devices utilizing transistors and having means for protecting said amplifiers from damages by short circuits or also casual variations of the load. It relates more particularly to a switching amplifier wherein, upon the application of a signal to an input terminal, an output stage is driven to saturation so as to generate a maximum current independent of the magnitude of the input signal.

In conventional transistorized direct-current amplifiers, direct current from the output transistor flows in the utilization device or load. But, owing to casual causes, the values of this load may vary and decrease to a virtual short circuit, resulting in the destruction of the output transistor.

The present invention has for its object the provision of a transistorized direct-current amplifier with means for insuring suitable operational conditions even though the load is varied over a wide range that would normally be detrimental to the life of the components of said amplifier device.

According to an important feature of the invention, the bias of the output transistor of the amplifier device is set, at any time, in dependence upon the actual value of the load traversed by the output curent of the device; this bias tends to limit the output current from the output transistor when the load becomes equal to or less than a predetermined minimum value.

According to another feature of the invention, means is provided for varying the load of the next-to-last transistor stage, which precedes the output transistor, in dependence upon the load of said output transistor whereby the base-emitter biasing current fed to the output transistor is held to a suitable value.

According to another feature of the invention, there is provided a load circuit connected to the transistor immediately preceding the output transistor, this circuit comprising a control transistor operating only in case the load of the output transistor exceeds the predetermined minimum value, thereby driving the output transistor to its saturation state. Thus, the arrival of an input signal in the presence of a normal load impedance leads to a temporary instability with consequent switching of the amplifier from its nonconductive stage to its alternate, i.e., highly conductive, stable condition; conversely, the cessation of that signal restores the original situation by a similar multivibrator-type interaction between the several transistors.

Further objects and features of the invention will become apparent from the ensuing description of an examplary embodiment thereof illustrated in the sole figure of the accompanying drawing.

In the figure there is represented a direct-current amplifier comprising two PNP transistors T1 and T2 each having a base, a collector and an emitter. The input of the two stage amplifier is a terminal C connected to the base of transistor T2 and the output thereof is a terminal S connected to the collector electrode of transistor T1. A load Z is connected between output terminal S and a terminal Y to which is applied a supply voltage of negative polarity. The emitter of stage T2 is connected to the base of stage T1. The emitter of stage T1 is connected to a terminal X to which is applied a supply voltage of positive polarity. The bases of transistors T1 and T2 are connected through resistors R6 and R7 respectively to a terminal P receiving a positive biasing potential; the coupling between transistors T2 and T1 will be recognized as an emitter-follower connection.

When there is no signal applied to terminal C, transistor T2 is held at cutoff, its base being positive with respect to the emitter. Simultaneously, output transistor T1 is held at cutoff, the absence of current flow through transistor T2 preventing the development of a biasing voltage across resistor R7. The simultaneity of cutoff of both transistors T1 and T2 is insured by a diode D2 which establishes on the base of transistor T1 a positive potential, with respect to the emitter, when no output current flows through transistor T2.

When the signal to be amplified is applied to input terminal C and hence to the base of transistor T2, said transistor T2 is no longer at cutoff and conducts, the current flow through its emitter biasing the base of transistor T1 to cause a current flow through the collector of transistor T1 in series with load terminals S, Y.

It will be noted that two impedance branches, A and B, are provided in the collector circuit of transistor T2. Branch A comprises a resistor R4 connected between terminal Y and the collector of stage T2; circuit B includes a resistor R2 in series with a variator V, a resistor R1, and an NPN control transistor T3 coupled to the collector of transistor T2 by its own collector. Resistor R2 is connected to terminal Y and a terminal of V is connected to the emitter of transistor T3. Resistor R1 is in shunt with the sereis combination of resistances, R2 and V. A resistor R3 is furthermore connected between terminal X and the emitter of transistor T3. Naturally the impedance branch B is energizable from transistor T2 only if control transistor T3 is not at cutoff. The result is that the state of transistor T3 controls effectively the functioning of circuit B and hence the bias current which transistor T2 delivers to the base of the output transistor T1.

The passive impedance branch A alone feeds the base of transistor T1 with a small current which produces a small curent flow through the load Z. The voltage drop across Z has such a magnitude that, if the impedance of load Z equals the predetermined minimum value, the potential of point S, i.e., of the base of transistor T3, is higher (i.e., more positive than the potential of the emitter of transistor T3 as determined by the circuit R3, R1, R2 and V. Thus, there is a current flow from transistor T3 when the value of Z is at least at its predetermined minimum. Under these conditions, circuit B provokes an increase of the emitter current of transistor T2 which in turn increases the base current of transistor T1, resulting in an increase of the current flow through load Z. Naturally, the values of the different components of the amplifier device involved are so chosen that the potential of point S is always higher than the potential of the emitter of transistor T3, whatever be the operating conditions of the device, and the increase of the base curent of transistor T1 goes on till transistor T1 is saturated. This drive of transistor T1 to its saturation state, due to the regenerative feedback between transistors T1 and T3 via junction S, is accelerated by varistor V, the impedance of which decreases as the voltage across its terminals increases. When transistor T3 initiates a curent flow through resistor R1, there is an increase of its emitter potential and hence a decrease of the impedance of varistor V so that the overall transistor T3 increases current flow through it. Varistor V thus causes a more pronounced increase of the bias current on the base of transistor T1 than would be caused by a mere voltage use at point S, resulting in a quicker drive of transistor T1 to its saturation state.

Under these conditions, if the impedance of Z is less than the predetermined minimum value, and if a signal is applied to terminal C, the potential of point S which is determined by the bias voltage created by passive circuit A is too small to allow a current flow through transistor T3 and the regenerative circuit B is unable to draw current from transistor T2. The base current of transistor T1 remains at the small value determined by circuit A and transistor T2 is so prevented from being destroyed.

If, with a signal applied to input terminal C and the current flow through transistor T1 at its maximum permissible value, the magnitude of impedance Z decreases so as to be less than the predetermined minimum value, there occurs a resulting decrease of the potential of point S. The current flow through transistor T3 decreases, thereby reducing the bias current supplied to transistor T1. Such a reduction results in a further potential drop at point S and this process goes on till transistor T3 is finally blocked. This latter action is speeded up by the varistor V which causes, as it is well known, a sharper decrease of the current flow through transistor T3 than if it were only caused by the potential drop of point S. Eventually, with transistor T3 at cutoff, only the circuit A remains active which limits the current flow through transistor T1 to such a small value that the transistor is prevented from being destroyed.

It is clear from the foregoing that the proposed device according to the invention modifies the operating conditions of the amplifier device, in response to any variation of the utilization device connected thereto, by a corresponding control of the current flow through the output transistor of the amplifier.

If, therefore, at the start of operation the impedance of the utilization device is less than the permissible threshold, the current flow through the output transistor is limited to a small value which cannot be detrimental to it. Conversely, if at the beginning of operation the utilization device connected to the amplifier has an impedance higher than this threshold, the output transistor is at saturation and cannot be destroyed since, owing to the relatively great load resistance, the current flow through that transistor is maintained within the proper limits.

If, however, during operation the load reaches a value which is less than the predetermined minimum, the current flow out of the output transistor is automatically and quickly reduced to a small value which prevents the destruction of the transistor.

Thus, whenever the impedance of the utilization device if of insufficient magnitude, the current flowing out of the amplifier is so limited that the output transistor is in no danger of destruction. An additional protection of the output transistor T1 is also ensured by the provision of the diode D1 whose plate is connected to a collector of transistor T1 through point S, said diode being also shunted across utilization device Z. This diode protects against the development of any reverse voltage across impedance Z when the transistor T1 is sharply driven to cutoff. Under normal operating conditions, the diode D1 is blocked and so has no effect upon the circuit. Upon a voltage reversal across the utilization device Z, however, diode D1 conducts and absorbs the so created energy which therefore does not reach the associated transistor T1, preventing its destruction.

The above description concerns only an examplary embodiment of a protected direct-current transistorized amplifier according to my invention and various modifications of which will occur to persons skilled in the art.

What I claim is:

1. A switching amplifier comprising an output transistor having a collector circuit in series with a pair of load terminals, an input circuit for said output transistor connected to receive an input signal, and a control transistor in said input circuit having a regenerative-feedback connection to said output transistor whereby the latter is switched between saturation and cutoff in response to the presence and absence, respectively, of an input signal at said input circuit, said control transistor being so connected across said load terminals as to become blocked upon the impedance of a load between said terminals decreasing below a predetermined threshold, thereby disabling said regenerative-feedback connection.

2. An amplifier as defined in claim 1, further comprising fixed resistance means connected in parallel with said control transistor for allowing a reduced current to traverse said output transistor and said load in the presence of said input signal and in the blocked condition of said control transistor.

3. An amplifier as defined in claim 1 wherein said regenerative-feedback connection includes variable resistance means for accelerating the switchover between saturation and cutoff.

4. A switching amplifier comprising a first transistor stage connected to receive an input signal, a second transistor stage having a collector circuit in series with a pair of load terminals, said first transistor stage being provided with an output circuit coupling same to said second transistor stage, and a control transistor in said output circuit having a regenerative-feedback connection to said second transistor stage whereby the latter is switched between saturation and cutoff in response to the presence and absence, respectively, of an input signal at said first transistor stage, said control transistor being so connected across said load terminals as to become blocked upon the impedance of a load between said terminals decreasing below a predetermined threshold, thereby disabling said regenerative-feedback connection.

5. An amplifier as defined in claim 4 wherein said output circuit includes a passive impedance branch in parallel with said control transistor for allowing a reduced current to traverse said second transistor and said load in the presence of said input signal and in the disabled condition of said regenerative-feedback connection.

6. An amplifier as defined in claim 5 wherein said output circuit further includes a fixed resistance in series with said control transistor and a varistor in parallel with said fixed resistance.

7. An amplifier as defined in claim 4 wherein said first transistor stage comprises a transistor of a polarity opposite that of said control transistor, the latter having a collector electrode connected to collector electrode of the transistor of said first stage.

8. An amplifier as defined in claim 7 wherein said second stage comprises a transistor of the same polarity as that of said first stage and coupled to the latter by an emitter-follower connection.

References Cited

UNITED STATES PATENTS

| | | | |
|---|---|---|---|
| 3,160,767 | 12/1964 | Tindall | 307—88.5 |
| 3,214,706 | 10/1965 | Mollinga | 330—22 |
| 3,233,115 | 2/1966 | Chou | 330—22 X |
| 3,303,380 | 2/1967 | Kozikowski | 330—19 X |

OTHER REFERENCES

Bertoya, "An A.G.C. Circuit Using a Thermistor and Transistors," Electronic Engineering, April 1963, pp. 236 and 237, 330–29.

General Electric Transistor Manual, Third Edition, Copyright 1958, p. 64, 307–88.5.

ROY LAKE, *Primary Examiner.*

J. B. MULLINS, *Assistant Examiner.*